(12) United States Patent
Nakajima et al.

(10) Patent No.: US 10,008,406 B2
(45) Date of Patent: Jun. 26, 2018

(54) ADHESIVE SHEET FOR LASER DICING AND METHOD FOR MANUFACTURING SEMICONDUCTOR DEVICE

(71) Applicant: Denka Company Limited, Chuo-ku, Tokyo (JP)

(72) Inventors: Gosuke Nakajima, Shibukawa (JP); Tomoaki Tanaka, Shibukawa (JP); Shigeru Tanaka, Shibukawa (JP)

(73) Assignee: Denka Company Limited, Chuo-ku, Tokyo (JP)

( * ) Notice: Subject to any disclaimer, the term of this patent is extended or adjusted under 35 U.S.C. 154(b) by 0 days. days.

(21) Appl. No.: 15/539,626

(22) PCT Filed: Oct. 27, 2015

(86) PCT No.: PCT/JP2015/080289
§ 371 (c)(1),
(2) Date: Jun. 23, 2017

(87) PCT Pub. No.: WO2016/103902
PCT Pub. Date: Jun. 30, 2016

(65) Prior Publication Data
US 2017/0365500 A1     Dec. 21, 2017

(30) Foreign Application Priority Data

Dec. 25, 2014   (JP) ................................ 2014-261750

(51) Int. Cl.
*H01L 21/683* (2006.01)
*H01L 21/78* (2006.01)
(Continued)

(52) U.S. Cl.
CPC ...... *H01L 21/6836* (2013.01); *B23K 26/0006* (2013.01); *B23K 26/0057* (2013.01);
(Continued)

(58) Field of Classification Search
None
See application file for complete search history.

(56) References Cited

U.S. PATENT DOCUMENTS 7,622,185 B2 * 11/2009 Wang ...................... C08J 7/04
428/327
8,106,522 B2 * 1/2012 Sato ...................... C09J 7/0278
257/783
(Continued)

FOREIGN PATENT DOCUMENTS

JP     2000080135 A  *  3/2000
JP         3762409 B2     4/2006
(Continued)

OTHER PUBLICATIONS

West, P. "Anatomy of an Application: Automatic Alignment in the Semiconductor Industry", Automated Vision Systems Inc., Aug. 16, 2006 downloaded from URL< https://web.archive.org/web/20060816033009/http://www.imagenation.com/pdf/align.pdf> on Dec. 20, 2017.*
(Continued)

*Primary Examiner* — Joseph Schoenholtz
(74) *Attorney, Agent, or Firm* — Christensen O'Connor Johnson Kindness PLLC; Llewellyn Lawson; Andrew Laughlin

(57) ABSTRACT

An adhesive sheet for laser dicing is provided that is capable of, in laser dicing by irradiation with laser light through the adhesive sheet, suppressing laser light scattering in the adhesive sheet while allowing easy chip division by expanding the adhesive sheet and enables inhibition of dust attachment during chip division for chip production in high yields. The present invention provides an adhesive sheet for laser dicing, including a substrate film having a back layer containing a friction reducing agent and an antistatic agent on one surface and having an adhesive layer on another surface,
(Continued)

wherein the back layer has a surface with arithmetic mean roughness Ra of 0.1 μm or less, the sheet has a tensile modulus of elasticity at 23° C. from 50 to 200 MPa, and the sheet has a parallel transmittance of 85% or more in a wavelength range from 400 to 1400 nm.

6 Claims, 1 Drawing Sheet

(51) Int. Cl.
*B23K 26/00* (2014.01)
*B23K 26/53* (2014.01)
*B23K 101/40* (2006.01)
*B23K 103/00* (2006.01)

(52) U.S. Cl.
CPC .............. *B23K 26/53* (2015.10); *H01L 21/78* (2013.01); *B23K 2201/40* (2013.01); *B23K 2203/56* (2015.10)

(56) References Cited

U.S. PATENT DOCUMENTS

| | | | |
|---|---|---|---|
| 8,236,416 B2* | 8/2012 | Kawata | C09J 7/0296 426/413 |
| 9,165,832 B1* | 10/2015 | Papanu | H01L 21/78 |
| 2005/0121781 A1* | 6/2005 | Shizuno | H01L 21/561 257/730 |
| 2005/0272223 A1 | 12/2005 | Fujii | |
| 2006/0121697 A1 | 6/2006 | Fujii | |
| 2008/0090382 A1 | 4/2008 | Fujii | |
| 2009/0042035 A1 | 2/2009 | Kawata | |
| 2010/0203707 A1 | 8/2010 | Fujii | |
| 2011/0136322 A1* | 6/2011 | Sato | C09J 7/0278 438/464 |
| 2012/0231266 A1* | 9/2012 | Saitoh | C09J 7/02 428/332 |
| 2012/0264871 A1* | 10/2012 | Moon | C08F 283/12 524/537 |
| 2013/0009284 A1 | 1/2013 | Fujii | |
| 2013/0012000 A1 | 1/2013 | Fujii | |
| 2013/0015167 A1 | 1/2013 | Fujii | |
| 2013/0316517 A1 | 11/2013 | Fujii | |
| 2015/0056785 A1 | 2/2015 | Fujii | |
| 2015/0303093 A1* | 10/2015 | Fujimoto | C09J 4/00 428/345 |
| 2015/0311119 A1 | 10/2015 | Fujii | |
| 2016/0111333 A1 | 4/2016 | Fujii | |
| 2016/0343617 A1 | 11/2016 | Fujii | |
| 2016/0343618 A1 | 11/2016 | Fujii | |
| 2016/0343619 A1 | 11/2016 | Fujii | |
| 2016/0343674 A1 | 11/2016 | Fujii | |
| 2017/0152407 A1* | 6/2017 | Nakajima | C09J 7/0275 |
| 2017/0200629 A1* | 7/2017 | Tsukui | H01L 21/6836 |
| 2017/0213757 A1* | 7/2017 | Nakamura | C09J 7/02 |

FOREIGN PATENT DOCUMENTS

| | | |
|---|---|---|
| JP | 2007-099984 A | 4/2007 |
| JP | 2008-021897 A | 1/2008 |
| JP | 2009-013183 A | 1/2009 |
| JP | 2011-139042 A | 7/2011 |
| JP | 2012-015236 A | 1/2012 |
| JP | 2012015236 A * | 1/2012 |
| JP | 5391158 B2 | 1/2014 |

OTHER PUBLICATIONS

Murakami, S., et al. "Laser Step Alignment for a Wafer Stepper." Optical Microlithography IV, 1985, doi:10.1117/12.947741.*
Machine Translation of JP 2012-01523.*
International Search Report dated Jan. 19, 2016, issued in corresponding International Application No. PCT/JP2015/080289, filed Oct. 27, 2015, 2 pages.

* cited by examiner

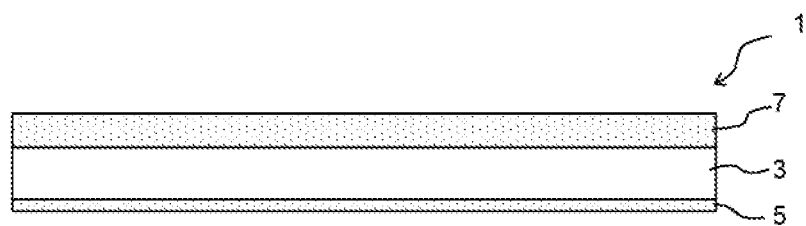

ADHESIVE SHEET FOR LASER DICING AND METHOD FOR MANUFACTURING SEMICONDUCTOR DEVICE

TECHNICAL FIELD

The present invention relates to an adhesive sheet and a method of manufacturing a semiconductor device using the same. More specifically, it relates to an adhesive sheet for laser dicing capable of, in laser dicing a semiconductor wafer with laser light, irradiation of laser light from the adhesive sheet side and to a method of manufacturing a semiconductor device including a step of processing a semiconductor wafer using the same.

BACKGROUND ART

A semiconductor wafer is formed with a circuit and then bonded to an adhesive sheet, followed by being arranged to each step of cutting (dicing) into small element pieces, washing, drying, drawing (expanding) of the adhesive sheet, peeling (picking up) the small element pieces from the adhesive sheet, mounting, and the like. The adhesive sheet (dicing tape) used in these steps is desired to have sufficient tack strength for the cut small element pieces (chips) from the dicing step to the drying step while having reduced tack strength to cause no adhesive transfer in the picking up step.

Meanwhile, with the increase in performance and miniaturization of IC devices in recent years, semiconductor chips are more reduced in thickness. Wafers conventionally with a thickness of approximately 350 µm are expected to be thinned even to 100 µm or less.

Silicon used as a semiconductor wafer is, however, a brittle material and has a risk of breakage during transportation and processing when being thinned. In particular, cracking or chipping during dicing of such a wafer with a rotating blade significantly reduces transverse strength of the chips.

As a method of inhibiting chipping, a so-called stealth dicing wafer dividing method is proposed where laser light at a wavelength in an infrared region is focused inside a semiconductor wafer to form a modified layer and the wafer is divided starting from the modified layer (PTL 1).

In this system, laser is generally incident from the circuit surface side of the wafer. The laser light, however, does not pass through a circuit surface with a test element group (TEG) or a metal film and is not capable of forming a modified layer inside the wafer.

To solve this problem, a method of forming a modified layer inside a wafer is proposed where laser light is irradiated through an adhesive sheet bonded to fix the wafer for incidence of the laser light from the back surface side of the wafer.

PTL 2 proposes an adhesive sheet having a Young's modulus at 23° C. from 30 to 600 MPa, a linear transmittance at a wavelength of 1064 nm of 80% or more, and a phase difference at a wavelength of 1064 nm of 100 nm or less.

PTL 3 proposes an adhesive sheet having a parallel transmittance in a wavelength range from 400 to 1100 nm of 80% or more and arithmetic mean roughness Ra on a backside of a substrate film (surface opposite to the surface with an adhesive layer formed thereon) from 0.1 to 0.3 µm.

CITATION LIST

Patent Literature

PTL 1: Japanese Patent No. 3762409
PTL 2: JP 2011-139042A
PTL 3: Japanese Patent No. 5391158

SUMMARY OF THE INVENTION

Technical Problem

In general laser light irradiation through an adhesive sheet, visible light is used for positioning. In the adhesive sheet of PTL 2, light transmittance in a visible region is not defined and has a risk of poor positioning. In addition, there is a description that the backside of the substrate film has an arithmetic average height Ra of a roughness curve of less than 0.1 µm. Ra less than 0.1 µm may cause sticking of adhesive sheets during feeding an adhesive sheet, and poor slidability of an adhesive sheet and difficulty in wafer division by expanding the adhesive sheet.

In the adhesive sheet of PTL 3, although light transmittance in a visible region is defined, the wafer may be divided poorly depending on the modulus of elasticity of the substrate film.

In laser dicing, dusting occurs when chips are divided. When dust is attached to the chips, the yields decrease and a washing step has to be added. An adhesive sheet is thus expected that does not cause attachment of foreign objects to chips while the wafer is divided.

The present invention has been made to solve the above problems and is to provide an adhesive sheet for laser dicing that is capable of, in laser dicing by irradiation with laser light through the adhesive sheet, suppressing laser light scattering in the adhesive sheet while allowing easy chip division by expanding the adhesive sheet and enables inhibition of dust attachment during chip division for chip production in high yields.

Solution to Problem

The present invention provides an adhesive sheet for laser dicing, including a substrate film having a back layer containing a friction reducing agent and an antistatic agent on one surface and having an adhesive layer on another surface, wherein the back layer has a surface with arithmetic mean roughness Ra of 0.1 µm or less, the sheet has a tensile modulus of elasticity at 23° C. from 50 to 200 MPa, and the sheet has a parallel transmittance of 85% or more in a wavelength range from 400 to 1400 nm.

When laser light is irradiated through an adhesive sheet, higher surface roughness of the back of the adhesive sheet (surface opposite to the surface with the adhesive layer formed thereon) increases laser light scattering in the back of the adhesive sheet and reduces the rectilinearity. From this perspective, the back of the adhesive sheet preferably has lower surface roughness. Meanwhile, lower surface roughness of the back of the adhesive sheet causes, for dividing the wafer by expanding the adhesive sheet, poor slidability of the adhesive sheet and difficulty in chip division. Due to such circumstances, laser light scattering suppression and good expandability of the adhesive sheet are trade-offs and there used to be no conventional adhesive sheet for laser dicing that sufficiently satisfies both these demands.

In such circumstances, the present inventors made intensive examination to obtain an adhesive sheet for laser dicing having more excellent properties than those of conventional sheet. They found that formation of a back layer containing a friction reducing agent and an antistatic agent on a backside of a substrate film, the back layer having a surface with arithmetic mean roughness Ra of 0.1 μm or less and the adhesive sheet having a tensile modulus of elasticity at 23° C. from 50 to 200 MPa, achieves both laser light scattering suppression and good expandability of the adhesive sheet and also inhibits attachment of foreign objects to have come to complete the present invention.

Advantageous Effects of Invention

The present invention enables irradiation of a semiconductor wafer with laser light through an adhesive sheet and inhibition of dust attachment during chip division and thus allows production of semiconductor chips in high yields.

BRIEF DESCRIPTION OF THE DRAWINGS

FIG. 1 is a cross-sectional view illustrating configuration of an adhesive sheet 1 for laser dicing in an embodiment of the present invention.

DESCRIPTION OF EMBODIMENTS

The following descriptions are given to preferred embodiments to carry out the present invention.

As illustrated in FIG. 1, an adhesive sheet 1 for laser dicing in an embodiment of the present invention has a substrate film 3 with a back layer 5 containing a friction reducing agent and an antistatic agent on one surface and an adhesive layer 7 on the other surface.
Adhesive Sheet 1

The adhesive sheet 1 has a tensile modulus of elasticity at 23° C. from 50 to 200 MPa and preferably from 70 to 180 MPa. When the adhesive sheet 1 has a tensile modulus of elasticity of less than 50 MPa, the adhesive sheet 1 is softened and the wafer may not be divided into chips by sheet expansion for chip division. When the adhesive sheet 1 has a tensile modulus of elasticity of more than 200 MPa, expansion becomes difficult.

The adhesive sheet 1 has a parallel transmittance in a wavelength range from 400 to 1400 nm of 85% or more and preferably 90% or more. A parallel transmittance of less than 85% in a wavelength range from 400 to 1400 nm causes reduction in rectilinearity of laser light, leading to reduction in yields.
Substrate Film 3

Examples of the substrate film 3 include polyvinyl chloride, polyethylene, polypropylene, polyester, ethylene-vinyl alcohol, polyurethane, and ionomer. Such a resin may be a molten mixture, a copolymer, or a multilayer sheet of a plurality of resins. The substrate film 3 may have a plurality of resin layers.

The substrate film 3 may be subjected to treatment, such as corona discharge and anchor coating, to improve close adhesion to the adhesive layer 7 and the back layer 5. The substrate film 3 preferably has a thickness from 80 to 100 μm. A substrate film 3 thinner than 80 μm may cause breakage of the adhesive sheet during expansion. A substrate film 3 thicker than 100 μm may reduce the parallel transmittance of the adhesive sheet 1 or not sufficiently transmit the force in expansion to the chips, resulting in inability to divide the wafer into the chips.

To obtain the back layer 5 having a surface with arithmetic mean roughness Ra of 0.1 μm or less, the back of the substrate film 3 preferably has sufficiently low surface roughness (preferably, Ra of 0.1 μm or less). A back layer 5 having a surface with arithmetic mean roughness Ra of more than 0.1 μm causes scattering of laser light during irradiation with the laser light through the adhesive sheet 1, resulting in reduction in yields. In contrast, a back layer 5 having a surface with low Ra may cause poor workability by sticking the adhesive sheet 1 to itself when feeding a roll of the adhesive sheet 1 or poor expandability. In the adhesive sheet 1 in the present embodiment, however, the back layer 5 contains a friction reducing agent to suppress these problems.
Back Layer 5

The back layer 5 is not particularly limited as long as the composition containing a friction reducing agent and an antistatic agent, while the composition preferably contains 100 parts by mass of an organic binder, from 0.005 to 10 parts by mass of the antistatic agent, and from 0.005 to 10 parts by mass of the friction reducing agent.
Friction Reducing Agent The friction reducing agent is, but not particularly limited to, a material to reduce a coefficient of friction between the adhesive sheet 1 and the expander, and examples include a silicone resin, a fluorine resin, (modified) silicone oil, and the like. These friction reducing agents may be used as a mixture of multiple components. In particular, a silicone-based graft copolymer is preferred because it has good compatibility with the back layer 5 to balance the antistatic properties and the expandability.

Examples of the silicone-based graft copolymer include a vinyl polymer produced by polymerizing a monomer having a vinyl group, such as a (meth)acryloyl group and a styryl group, (hereinafter, referred to as "a silicone-based monomer") with a monomer having a vinyl group, such as a (meth)acrylic monomer and styrene, or the like at end of silicone molecular chain (e.g., see JP 2000-080135A, etc.).

Examples of the (meth)acrylic monomer used for the silicone-based graft copolymer include alkyl (meth)acrylate, hydroxyalkyl (meth)acrylate, modified hydroxy(meth)acrylate, (meth)acrylic acid, and the like. Among them, alkyl (meth)acrylate is preferably used.

Examples of such alkyl (meth)acrylate include methyl (meth)acrylate, ethyl (meth) acrylate, n-propyl (meth) acrylate, n-butyl (meth) acrylate, isobutyl (meth) acrylate, t-butyl (meth) acrylate, 2-ethylhexyl (meth) acrylate, lauryl (meth) acrylate, stearyl (meth) acrylate, isobornyl (meth) acrylate, hydroxyalkyl (meth)acrylate, and the like.

Examples of such hydroxyalkyl (meth)acrylate include hydroxyethyl (meth)acrylate, hydroxypropyl (meth)acrylate, hydroxybutyl (meth)acrylate, and the like.

Examples of such modified hydroxy(meth)acrylate include ethylene oxide-modified hydroxy(meth)acrylate, lactone-modified hydroxy(meth)acrylate, and the like.

The ratio of the silicone-based monomer to other monomers having a vinyl group is preferably, but not particularly limited to, from 15 to 50 parts by mass based on 100 parts by mass of the silicone-based graft copolymer. A smaller silicone-based monomer content may cause insufficient and non-uniform drawing of the adhesive sheet during expansion, and an excessive content may cause an increase in cost.

The amount of the friction reducing agent to be blended is preferably, but not particularly limited to, from 0.005 to 10 parts by mass based on 100 parts by mass of an organic binder. A smaller amount of the friction reducing agent may cause insufficient expansion of the adhesive sheet and an excessive amount may reduce the antistatic effect.

Antistatic Agent

Examples of the antistatic agent include, but not particularly limited to, a quaternary amine salt monomer and the like.

Examples of the quaternary amine salt monomer include dimethylaminoethyl(meth)acrylate quaternary chloride, diethylaminoethyl (meth)acrylate quaternary chloride, methylethylaminoethyl (meth)acrylate quaternary chloride, p-dimethylaminostyrene quaternary chloride, p-diethylaminostyrene quaternary chloride, and the like. Among them, dimethylaminoethylmethacrylate quaternary chloride is preferably used.

The amount of the antistatic agent is preferably, but not particularly limited to, from 0.005 to 10 parts by mass based on 100 parts by mass of an organic binder. An insufficient amount of the antistatic agent may cause the antistatic effect not to be exhibited and an excessive amount may cause reduction in close adhesion between the substrate film 3 and the back layer 5.

Organic Binder

Examples of the organic binder include, but not particularly limited to, (meth)acrylate-based, acrylic, urethane-based, polyester-based, epoxy-based, polyvinyl chloride-based, melanin-based, polyimide-based, and silicone-based polymers, and the like.

The (meth)acrylate-based polymer is a polymer of a vinyl compound having a (meth)acrylate monomer unit. The (meth)acrylate-based polymer may have a monomer unit derived from a functional group containing monomer, styrene, vinyl toluene, allyl acetate, (meth)acrylonitrile, vinyl acetate, vinyl propionate, vinyl butyrate, vinyl versatate, vinyl ethyl ether, vinyl propyl ether, vinyl isobutyl ether, or the like.

As the (meth)acrylate-based polymer, a copolymer of a (meth)acrylate monomer and a functional group containing monomer may be preferably used.

The functional group containing monomer is a monomer having a functional group, such as a hydroxyl group, a carboxyl group, an epoxy group, an amide group, an amino group, a methylol group, a sulfonic acid group, a sulfamic acid group, and a phosphoric (phosphorous) ester group.

The (meth)acrylate-based polymer is preferably used as the organic binder for the reasons of (1) having good compatibility with the antistatic agent and the friction reducing agent, (2) capable of enhancing close adhesion between the back layer 5 and the substrate film 3, and the like.

Examples of the (meth)acrylate monomer include butyl (meth)acrylate, 2-butyl (meth) acrylate, t-butyl (meth) acrylate, pentyl (meth) acrylate, octyl (meth) acrylate, 2-ethylhexyl (meth)acrylate, nonyl (meth)acrylate, decyl (meth) acrylate, lauryl (meth)acrylate, methyl (meth)acrylate, ethyl (meth)acrylate, isopropyl (meth)acrylate, tridecyl (meth) acrylate, myristyl (meth)acrylate, cetyl (meth)acrylate, stearyl (meth)acrylate, cyclohexyl (meth)acrylate, benzyl (meth)acrylate, and the like. As the (meth)acrylate monomer, a plurality of components may be used in combination.

Examples of the monomer having a hydroxyl group include 2-hydroxyethyl (meth) acrylate, 2-hydroxypropyl (meth) acrylate, 2-hydroxybutyl (meth) acrylate, and the like.

Examples of the monomer having a carboxyl group include (meth)acrylic acid, crotonic acid, maleic acid, maleic anhydride, itaconic acid, fumaric acid, acrylamide N-glycolic acid, cinnamic acid, and the like.

Examples of the monomer having an epoxy group include allyl glycidyl ether, glycidyl ether (meth)acrylate, and the like.

Examples of the monomer having an amide group include (meth)acrylamide and the like. Examples of the monomer having an amino group include N,N-dimethylaminoethyl (meth)acrylate and the like. Examples of the monomer having a methylol group include N-methylol acrylamide and the like. As the functional group containing monomer, a plurality of components may be used in combination.

As the (meth)acrylate-based polymer, a monomer other than the above may be used as appropriate, such as styrene, vinyl toluene, allyl acetate, (meth)acrylonitrile, vinyl acetate, vinyl propionate, vinyl butyrate, vinyl versatate, vinyl ethyl ether, vinyl propyl ether, and vinyl isobutyl ether, for example.

In the back layer 5, various additives may be added, such as a curing agent, a plasticizer, an antioxidant, a filler, and an inorganic lubricant.

Examples of the method of forming the back layer 5 include, but not particularly limited to, a method of direct application on the substrate film 3 by a coater, such as a gravure coater, a comma coater, a bar coater, a knife coater, and a roll coater, and a method of printing by anastatic printing, intaglio printing, planographic printing, flexographic printing, offset printing, screen printing, or the like.

The back layer 5 thus formed preferably has a thickness after drying from 0.1 to 20 μm. A thinner thickness may cause the antistatic effect not to be exhibited, while excessive application does not lead to a further effect and is not economical.

Adhesive Layer 7

The adhesive layer 7 is formed by applying an adhesive on the substrate film 3. Examples of the adhesive include, but not particularly limited to, a rubber-based adhesive, an acrylic adhesive, a urethane-based adhesive, a silicone-based adhesive, and the like. Since an ultraviolet curing adhesive is preferred in the present embodiment, an acrylic adhesive is preferably used. In that case, for example, an adhesive is used that contains a (meth)acrylate copolymer, a photopolymerizable compound having two or more photopolymerizable carbon-carbon double bonds in the molecule, a polyfunctional isocyanate curing agent, and a photopolymerization initiator.

In the adhesive, various additives may be added as appropriate, such as a tackifier, a curing agent, a plasticizer, a photopolymerizable compound, a photoinitiator, a foaming agent, a polymerization inhibitor, an antioxidant, and a filler.

Examples of the method of forming the adhesive layer 7 include, but not particularly limited to, a method of direct application on the substrate film 3 by a coater, such as a gravure coater, a comma coater, a bar coater, a knife coater, and a roll coater, and a method of printing by anastatic printing, intaglio printing, planographic printing, flexographic printing, offset printing, screen printing, or the like. The adhesive layer after drying preferably has a thickness from 2 to 30 μm. An adhesive layer thinner than 2 μm may exhibit insufficient tack strength. In contrast, an adhesive layer thicker than 30 μm may reduce the parallel transmittance of the adhesive sheet 1 or not sufficiently transmit the force in expansion to the chips, resulting in inability to divide the wafer into the chips.

Method of Manufacturing Semiconductor Device

The adhesive sheet 1 for laser dicing in the present embodiment is preferably used for laser dicing by irradiating a semiconductor wafer having a circuit formed on the front surface with laser light through the adhesive sheet. As disclosed in PTL 1, such laser dicing is preferably, but not limited to, stealth dicing to form a modified portion inside the semiconductor wafer by irradiation with laser light for dividing the semiconductor wafer starting from the modified portion while it may be any dicing with laser light.

Here, a description is given to a of a semiconductor wafer processing procedure in the method of manufacturing a semiconductor device using the adhesive sheet 1.

First, the adhesive sheet 1 is bonded to a back surface or a front surface of a semiconductor wafer having a circuit formed on the front surface (bonding step).

Next, the semiconductor wafer is positioned by irradiating the semiconductor wafer with laser light at a wavelength in a visible region through the adhesive sheet 1 (positioning step).

Then, a modified portion is formed inside the semiconductor wafer by irradiating the wafer with laser light at a wavelength in an infrared region through the adhesive sheet 1 (modified portion forming step).

Then, chips are produced by expanding the adhesive sheet 1, thereby dividing the semiconductor wafer (expansion step).

As described above, in the adhesive sheet 1, the back layer 5 that is formed on the backside of the substrate film 3 has a surface with arithmetic mean roughness Ra of 0.1 μm or less and has a parallel transmittance of 85% or more in a wavelength range from 400 to 1400 nm. When laser light at a wavelength in a visible region or an infrared region is irradiated through the adhesive sheet 1, laser light of high rectilinearity thus passes through the adhesive sheet 1 with high transmittance. Accordingly, the positioning and modified portion forming steps are readily and appropriately performed.

In addition, the adhesive sheet 1 has a tensile modulus of elasticity at 23° C. from 50 to 200 MPa and has the back layer 5 containing a friction reducing agent and an antistatic agent formed on the backside of the substrate film 3. The adhesive sheet 1 is thus readily drawn to a reasonable extent and readily slidable to the expander, and the expansion step is accordingly readily carried out. Moreover, the back layer 5 contains an antistatic agent, inhibiting attachment of foreign objects to the divided chips.

EXAMPLES

The present invention is described with Examples although it is not limited to Examples below.

Materials Used

Organic binder: copolymer of methyl methacrylate and n-butyl methacrylate, commercially available product.

Antistatic agent: dimethylaminoethylmethacrylate quaternary chloride (quaternary amine-based vinyl monomer), commercially available product.

Friction reducing agent: silicone-based graft copolymer, containing 30 parts by mass of silicone oligomer-based units having a (meth)acryloyl group at end of silicone molecular chain and produced by polymerizing 70 parts by mass of acrylic vinyl units, commercially available product.

Acrylate copolymer: 2-ethylhexyl acrylate/methyl acrylate/acrylic acid/2-hydroxyethyl acrylate=22/71.5/6/0.5 (mass ratio), Mw=180 thousand, Tg=−10° C., commercially available product.

Photopolymerizable compound: urethane acrylate produced by hexamethylene diisocyanate and dipentaerythritol pentaacrylate, commercially available product.

Curing agent: adduct of toluene diisocyanate and trimethylolpropane triacrylate, commercially available product.

Photopolymerization initiator: benzyl dimethyl ketal, commercially available product.

Substrate film: ionomer resin with a thickness of 80 μm, commercially available product.

Example 1

An adhesive sheet 1 was prepared as follows.

Back Layer 5

A solution of 100 parts by mass of the organic binder, 10 parts by mass of the antistatic agent, and 10 parts by mass of the friction reducing agent mixed therein was applied on a substrate film 3 with a gravure coater to form a back layer 5 with a thickness of 1 μm.

Adhesive

An adhesive was used that contained 50 parts by mass of the photopolymerizable compound, 3 parts by mass of the curing agent, and 3 parts by mass of the photopolymerization initiator blended based on 100 parts by mass of the acrylate copolymer.

Production of Adhesive Sheet

An ultraviolet curing adhesive was coated on a separator film made of polyethylene terephthalate to have the adhesive layer 7 after drying with a thickness of 10 μm. This adhesive layer 7 was coated on a surface, opposite to the back layer 5, of the substrate film 3 provided in advance with the back layer 5 with a thickness of 1 μm and then aged at 40° C. for 7 days to obtain an adhesive sheet 1.

Evaluation Method

Arithmetic mean roughness Ra: arithmetic mean roughness Ra of the surface of the back layer 5 was obtained from an average of N=10 measurements using a surface roughness measurement instrument (Surftest SJ-301) manufactured by Mitutoyo Corp. in accordance with JIS B0601: 2001.

Tensile modulus of elasticity: tensile modulus of elasticity of the adhesive sheet 1 was measured at a stress rate of 5 mm/min. in an environment of 23° C. and 50% humidity using a universal tensile tester (Tensilon RTA-T-2M manufactured by Orientec Corp.) in accordance with JIS K7161: 1994. For the tensile modulus of elasticity of the adhesive sheet, a tensile modulus of elasticity of the adhesive sheet before ultraviolet irradiation was measured.

Parallel transmittance: parallel transmittance of the adhesive sheet 1 was measured using a spectral haze meter HSP-150V manufactured by Murakami Color Research Laboratory Co., Ltd. in accordance with JIS K 7361-1:1999. The lowest transmittance in the measured wavelength range from 400 to 1400 nm is shown in tables below.

Coefficient of kinetic friction: coefficient of kinetic friction of the back layer 5 of the adhesive sheet 1 was measured in an environment of 23° C. and 50% humidity using a friction meter TR-2 (manufactured by Toyo Seiki Seisakusho, Ltd.) in accordance with JIS K 7125.

Antistatic properties: surface resistivity of the back layer 5 of the adhesive sheet 1 were measured in an environment of 23° C. and 50% humidity using an electrometer (R8340A manufactured by Advantest Corp.) and a resistivity chamber (R12704A manufactured by Advantest Corp.) in accordance with JIS K 6911.

Chip divisibility: the adhesive sheet 1 was bonded to a ground silicon wafer with a diameter of 8 inches and a thickness of 100 μm and laser light was irradiated through the adhesive sheet 1 to form a modified layer inside the silicon wafer. After that, using an expander, the adhesive sheet was expanded at a pull-down amount of 20 mm and an expansion rate of 10 mm/s to divide the wafer into chips. Evaluation was made based on chip division ratio by the following criteria.

A: chip division ratio of 95% or more
B: chip division ratio of 90% or more and less than 95%
C: chip division ratio of less than 90%
Laser light was irradiated in the following conditions.
Light source: Nd-YAG laser
Wavelength: 1064 nm
Repetition frequency: 100 kHz
Pulse width: 30 ns
Cutting speed: 100 mm/sec.
Wafer size: 50 mm×50 mm (square)
Cut chip size: 5 mm×5 mm Presence of foreign objects: ten divided chips were observed with an optical microscope to check whether dust of 2 μm or greater was attached. Results are shown in Table 1.

Examples 2 to 11 and Comparative Examples 1 to 4

An adhesive sheet was prepared for evaluation in the same manner as Example 1 other than changing the amounts of the antistatic agent and the friction reducing agent, the type and the thickness of substrate film 3, and the surface roughness of the back layer 5 surface as shown in Tables 1 and 2. Results are shown in Tables 1 and 2.

Table 1

TABLE 1

| | Examples | | | | | | | | | | |
|---|---|---|---|---|---|---|---|---|---|---|---|
| | 1 | 2 | 3 | 4 | 5 | 6 | 7 | 8 | 9 | 10 | 11 |
| Type of Substrate Film | Ionomer | Ionomer | Ionomer | Ionomer | Ionomer | Ionomer | Ionomer | Ionomer | Ionomer | Polyvinyl Chloride | Ionomer/ Polyethylene |
| Thickness of Substrate Film/μm | 80 | 100 | 80 | 85 | 85 | 80 | 80 | 80 | 125 | 80 | 85 |
| Amount of Antistatic Agent/ parts by mass | 10 | 10 | 0.005 | 2 | 8 | 10 | 10 | 10 | 10 | 10 | 10 |
| Amount of Friction Reducing Agent/parts by mass | 10 | 0.005 | 10 | 8 | 2 | 10 | 10 | 10 | 10 | 10 | 10 |
| Surface Roughness of Back Layer Surface/μm | 0.08 | 0.09 | 0.09 | 0.10 | 0.10 | 0.08 | 0.09 | 0.10 | 0.10 | 0.10 | 0.08 |
| Coefficient of Kinetic Friction | 0.13 | 0.30 | 0.12 | 0.17 | 0.21 | 0.14 | 0.13 | 0.12 | 0.12 | 0.14 | 0.21 |
| Surface Resistivity/Ω/□ | $4.9 \times 10^8$ | $4.3 \times 10^8$ | $9.3 \times 10^9$ | $3.3 \times 10^9$ | $6.1 \times 10^8$ | $5.0 \times 10^8$ | $5.2 \times 10^8$ | $5.4 \times 10^8$ | $5.4 \times 10^8$ | $5.0 \times 10^8$ | $5.0 \times 10^8$ |
| Thickness of Adhesive Layer/μm | 10 | 20 | 10 | 5 | 5 | 10 | 10 | 30 | 10 | 30 | 10 |
| Parallel Transmittance/% | 88 | 88 | 89 | 88 | 86 | 88 | 89 | 87 | 85 | 86 | 89 |
| Tensile Modulus of Elasticity/MPa | 97 | 105 | 100 | 150 | 150 | 72 | 180 | 100 | 100 | 58 | 170 |
| Chip Divisibility | 99% A | 92% B | 99% A | 98% A | 98% A | 96% A | 98% A | 96% A | 91% B | 95% A | 99% A |
| Presence of Attached Foreign Object | Not Found (0/10) | Not Found (0/10) | Found (1/10) | Not Found (0/10) | Not Found (0/10) | Not Found (0/10) | Not Found (0/10) | Not Found (0/10) | Not Found (0/10) | Not Found (0/10) | Not Found (0/10) |

TABLE 2

| | Comparative Examples | | | |
|---|---|---|---|---|
| | 1 | 2 | 3 | 4 |
| Type of Substrate Film | Ionomer | Ionomer | Ionomer | PET |
| Thickness of Substrate Film/μm | 80 | 80 | 80 | 100 |
| Amount of Antistatic Agent/parts by mass | — | 10 | 10 | 10 |
| Amount of Friction Reducing Agent/parts by mass | 10 | — | 10 | 10 |
| Surface Roughness of Back Layer Surface/μm | 0.08 | 0.08 | 0.35 | 0.10 |
| Coefficient of Kinetic Friction | 0.13 | 0.71 | 0.14 | 0.17 |
| Surface Resistivity/Ω/□ | $1.0 \times 10^{15}$ | $4.3 \times 10^8$ | $4.5 \times 10^8$ | $4.3 \times 10^8$ |
| Thickness of Adhesive Layer/μm | 10 | 20 | 10 | 5 |
| Parallel Transmittance/% | 88 | 88 | 62 | 90 |
| Tensile Modulus of Elasticity/MPa | 97 | 105 | 100 | 500 |
| Chip Divisibility | 99% A | 60% C | 30% C | 0% C |
| Presence of Attached Foreign Object | Found (10/10) | Not Found (0/10) | Not Found (0/10) | — |

The adhesive sheets 1 in Examples 1 to 11 had a parallel transmittance of 85% or more and exhibited a reasonable tensile modulus of elasticity and reasonable antistatic properties. These sheets thus had high chip division ratio and were capable of inhibiting attachment of foreign objects after division. These sheets also exhibited high transmittance to visible light and thus the wafer was readily positioned. In contrast, in Comparative Examples 1 to 4, the chip division ratio was low and foreign objects were attached to the divided chips.

In Comparative Example 1, because no antistatic agent was blended in the back layer 5, foreign objects were attached to the divided chips.

In Comparative Example 2, because no friction reducing agent was blended in the back layer 5, the chip divisibility was worse.

In Comparative Example 3, because the back layer 5 surface had excessively high surface roughness, the chip divisibility was worse.

In Comparative Example 4, because the substrate film 3 had an excessively high tensile modulus, the chip divisibility was worse.

The invention claimed is:

1. An adhesive sheet for laser dicing, comprising a substrate film having a back layer containing a friction reducing agent and an antistatic agent on one surface and having an adhesive layer on another surface, wherein
    the back layer has a surface with arithmetic mean roughness Ra of 0.1 µm or less,
    the adhesive sheet has a tensile modulus of elasticity at 23° C. from 50 to 180 MPa,
    the adhesive sheet has a parallel transmittance of 85% or more in a wavelength range from 400 to 1400 nm, and
    a coefficient of kinetic friction of the back layer of the adhesive sheet at 23° C. is greater than or equal to 0.12 and less than or equal to 0.30.

2. The sheet of claim 1, wherein the friction reducing agent is a silicone-based graft copolymer.

3. The sheet of claim 1, wherein the antistatic agent is a quaternary amine salt monomer.

4. The sheet of claim 1, wherein the back layer contains 100 parts by mass of an organic binder, from 0.005 to 10 parts by mass of the antistatic agent, and from 0.005 to 10 parts by mass of the friction reducing agent.

5. The sheet of claim 4, wherein the organic binder is a (meth)acrylate copolymer.

6. A method of manufacturing a semiconductor device, comprising:
    bonding the adhesive sheet of claim 1 to a back surface or a front surface of a semiconductor wafer having a circuit formed on the front surface;
    positioning the wafer by irradiating the wafer with laser light at a wavelength in a visible region through the adhesive sheet;
    forming a modified portion inside the wafer by irradiating the wafer with laser light at a wavelength in an infrared region through the adhesive sheet; and
    producing a chip by expanding the adhesive sheet, thereby dividing the wafer.

* * * * *